(12) United States Patent
Sharma

(10) Patent No.: US 12,107,585 B2
(45) Date of Patent: Oct. 1, 2024

(54) COMPARATOR CIRCUITS

(71) Applicant: GlobalFoundries U.S. Inc., Malta, NY (US)

(72) Inventor: Santosh Sharma, Austin, TX (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/956,273

(22) Filed: Sep. 29, 2022

(65) Prior Publication Data

US 2024/0113702 A1 Apr. 4, 2024

(51) Int. Cl.
*H03K 5/22* (2006.01)
*H03K 17/687* (2006.01)

(52) U.S. Cl.
CPC .......... *H03K 5/22* (2013.01); *H03K 17/6871* (2013.01)

(58) Field of Classification Search
CPC .............................. H03K 5/22; H03K 17/6871
See application file for complete search history.

(56) References Cited

U.S. PATENT DOCUMENTS

| | | | |
|---|---|---|---|
| 6,229,350 B1 | 5/2001 | Ricon-Mora | |
| 9,105,703 B2 | 8/2015 | Briere | |
| 9,147,760 B2 | 9/2015 | Mishra et al. | |
| 9,571,093 B2 | 2/2017 | Kinzer et al. | |
| 11,658,236 B2 * | 5/2023 | Udrea | H01L 29/861 |
| | | | 257/194 |
| 2003/0122595 A1 * | 7/2003 | Hall | H03K 17/6872 |
| | | | 327/112 |
| 2011/0181218 A1 | 7/2011 | Tsuchiya | |
| 2014/0203288 A1 | 7/2014 | Hsiung | |
| 2016/0072494 A1 * | 3/2016 | Lin | G11C 7/062 |
| | | | 327/74 |
| 2017/0125572 A1 | 5/2017 | Curatola et al. | |
| 2019/0310677 A1 * | 10/2019 | Terasaki | G01R 19/16519 |
| 2020/0251586 A1 | 8/2020 | Otake | |
| 2020/0357909 A1 | 11/2020 | Udrea et al. | |
| 2020/0382073 A1 * | 12/2020 | Joyce | H03F 3/45475 |
| 2021/0067149 A1 * | 3/2021 | Yasusaka | H03K 5/2472 |
| 2022/0057825 A1 * | 2/2022 | Shiina | G05F 3/30 |
| 2022/0238694 A1 | 7/2022 | Yang et al. | |

FOREIGN PATENT DOCUMENTS

CN 101582628 B * 6/2011

OTHER PUBLICATIONS

King-Yuen Wong et al., "Integrated voltage reference and comparator circuits for GaN smart power chip technology", 2009 21st International Symposium on Power Semiconductor Devices & IC's, 2009, pp. 57-60, doi: 10.1109/ISPSD.2009.5158000, Abstract, 3 pages.

(Continued)

*Primary Examiner* — Metasebia T Retebo
(74) *Attorney, Agent, or Firm* — Daivd Cain; Andrew M. Calderon; Calderon Safran & Wright P.C.

(57) ABSTRACT

The present disclosure relates to a circuit and, more particularly, to comparator circuits used with a depletion mode device and methods of operation. The circuit includes: a comparator; a transistor connected to an output of the comparator; and a depletion mode device connected to ground and comprising a control gate connected to the transistor.

20 Claims, 2 Drawing Sheets

(56) References Cited

OTHER PUBLICATIONS

Application and Drawings for U.S. Appl. No. 17/902,463, filed Sep. 2, 2022, 27 pages.
European Search Report dated Feb. 8, 2024 in EP Application No. 23190154.7-1205, 10 pages.
Oliver Hilt et al., "Normally-off AlGaN/GaN HFET with p-type GaN Gate and AlGaN Buffer", Integrated Power Electronics Systems (CIPS), 2010 6th International Conference On, IEEE, Mar. 16, 2010 (Mar. 16, 2010), pp. 1-4, XP031930531, ISBN: 978-1-61284-814-3, 4 pages.
The partial European Search Report and Opinion dated May 2, 2024 in EP Application No. 23186269.9-1211/4333042, 17 pages.
The Extended European Search Report and Opinion dated Jun. 17, 2024 in EP Application No. 23186269.9-1211/4333042, 16 pages.

\* cited by examiner

COMPARATOR CIRCUITS

FIELD OF THE INVENTION

The present disclosure relates to a circuit and, more particularly, to comparator circuits used with a depletion mode device and methods of operation.

A hysteresis comparator is operated by applying a positive feedback to a comparator. The potential difference between the high and low output voltages and the feedback resistor can be adjusted to change the voltage that is taken as a comparison reference to the input voltage.

Existing hysteretic comparators in GaN use a multiplier based on GaN HEMT Vth for setting the hysteresis voltage. This can make the hysteresis extremely process dependent (GaN Vth can vary).

Another option to control hysteresis is the use of a Schmitt trigger device. Schmitt trigger devices are used in signal conditioning applications to remove noise from signals used in digital circuits. In electronics, a Schmitt trigger is a comparator circuit with hysteresis implemented by applying positive feedback to the noninverting input of a comparator or differential amplifier. The circuit is considered a trigger because the output retains its value until the input changes sufficiently to trigger a change. In the non-inverting configuration, when the input is higher than a chosen threshold, the output is high. When the input is below a different (lower) chosen threshold, the output is low, and when the input is between the two levels the output retains its value.

SUMMARY

In an aspect of the disclosure, a circuit comprises: a comparator; a transistor connected to an output of the comparator; and a depletion mode device connected to ground and comprising a control gate connected to the transistor.

In an aspect of the disclosure, a circuit comprises: a comparator which compares a fixed, reference voltage to a moving voltage; a transistor which is controlled by an output of the comparator; and a control gate integrated with a depletion mode device, which is pulled to ground when an output of the transistor is high and pulled to a predetermined voltage when the output of the transistor is low.

In an aspect of the disclosure, a method of operation comprises: controlling an ON state and OFF state of a transistor by using an output of a comparator; bringing a depletion mode device to ground when the transistor is in the ON state; and pulling an enhancement mode device to Vdd1 when the transistor is in the OFF state.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a circuit and, more particularly, to comparator circuits used with a depletion mode device and methods of operation. In embodiments, the circuits may be a hysteretic comparator or ring oscillator used with a comparator. More specifically, the hysteretic comparator circuit and ring oscillator circuit each comprise a depletion mode device which has a pinch off voltage controllable by the hysteretic comparator circuit or ring oscillator circuit, respectively. In embodiments, inputs to the comparator may be protected against noise spikes with fixed pinch off depletion mode devices. Advantageously, the present disclosure provides hysteresis independent of GaN Vt and is programmable with a ground referenced programming voltage.

Figure 1:
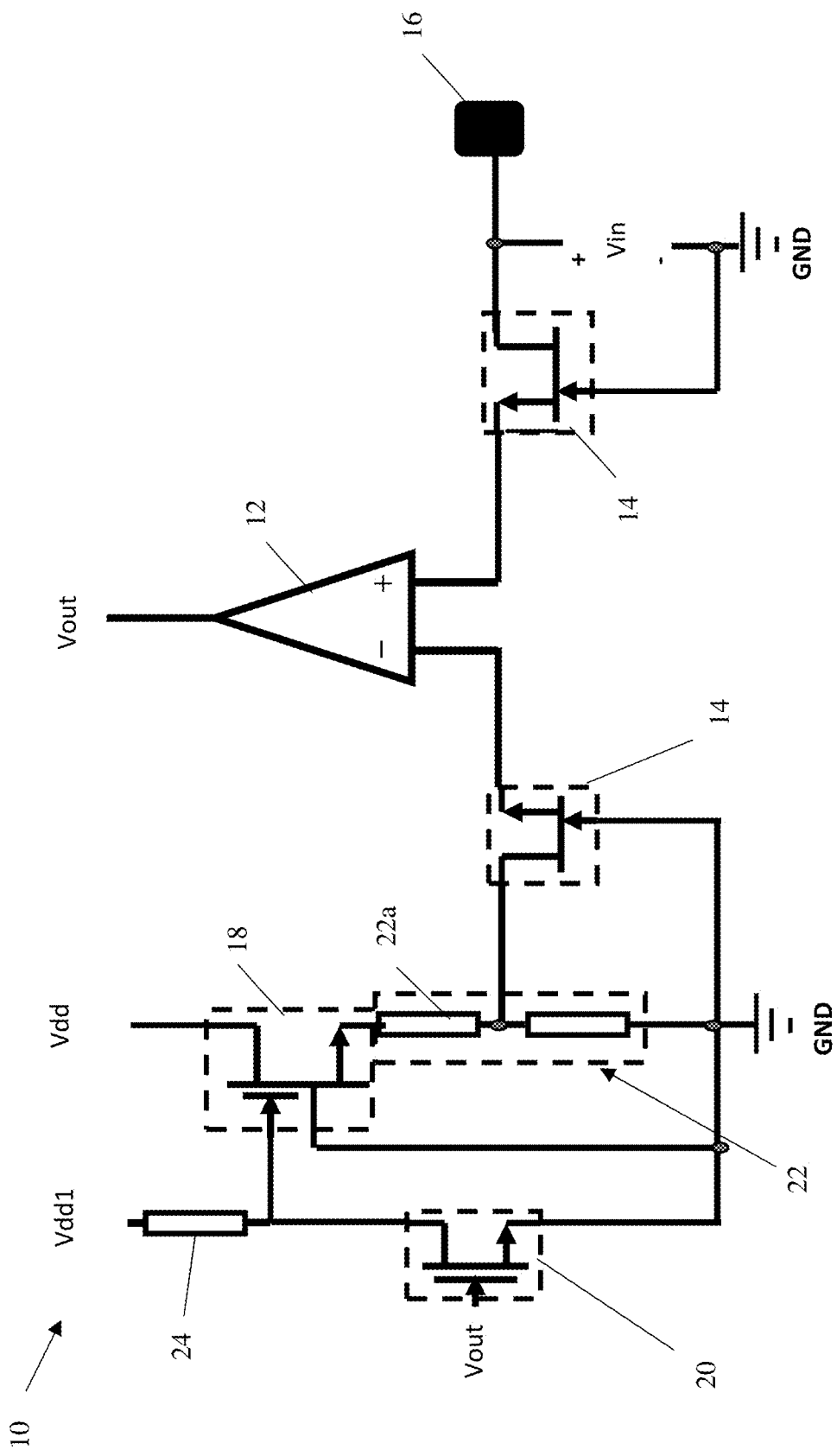
FIG. 1 shows a hysteretic comparator circuit in accordance with aspects of the present disclosure.

FIG. 1 shows a hysteretic comparator in accordance with aspects of the present disclosure. More specifically, the hysteretic comparator 10 includes a comparator 12 isolated, in embodiments, by clamps 14. In a specific example, the clamps 14 may be transistors and, more specifically, depletion mode devices (i.e., fixed pinch off depletion mode devices) that protect the comparator 12 from noise, e.g., voltage spikes or current spikes from a fixed voltage, Vdd, and a moving voltage, Vin. In embodiments, the clamps 14 may be optional.

In embodiments, the moving voltage, e.g., Vin, is provided by input 16 and fed as a positive (+) voltage into a non-inverting input of the comparator 12. The input 16 may be representative of an input pad or an input signal (e.g., V+) inside or outside of the chip, as examples. On the other hand, Vdd is fed through a control gate (e.g., PGaN gate) of a depletion mode device 18 and a resistor 22a of a resistor divider 22 to provide a fixed, reference voltage (e.g., −V) to the comparator 12 (e.g., inverting input to the comparator 12).

The output (Vout) of the comparator 12 may be fed to an input of a transistor 20. The output of the transistor 20, in turn, is used to control the pinch-off voltage of the depletion mode device 18. The transistor 20 may be an enhancement mode device. A resistor 24 may be provided between Vdd1 and the depletion mode device 18. The depletion mode device 18 may also be connected to ground, GND.

In embodiments, the control gate, e.g., pGaN gate, may be integrated with the depletion mode device 18. The pGaN gate provides an enhancement mode operation. As should be understood by those of ordinary skill in the art, in field-effect transistors (FETs), a depletion mode device and enhancement mode device are two major transistor types, corresponding to whether the transistor is in an on state or an off state at zero gate-source voltage. For example, the enhancement-mode device, which is a common switching element in integrated circuits, is off at zero gate-source voltage. On the other hand, in a depletion-mode device, the device is normally on at zero gate-source voltage. Such devices are used as load "resistors" in logic circuits (in depletion-load NMOS logic, for example).

In operation, controlling the gate voltage of the transistor 20 will modulate the gate voltage, e.g., pinch-off voltage, of the depletion mode device 18. By way of example, the moving voltage, Vin, and the fixed, reference voltage, Vdd, may be fed into the respective inputs of the comparator 12, e.g., + and − inputs of the comparator. The output, Vout, of the comparator 12 may be fed into the transistor 20 which, in turn, controls the ON and OFF states of the transistor 20. The ON and OFF states of the transistor 20 may be used to control the pinch-off voltage at the control gate, e.g., pGaN gate, of the depletion mode device 18. As should be understood by those of skill in the art, as the fixed, reference voltage Vdd becomes higher, the input voltage, Vin, also needs to be higher before the output changes from "0" to another state. Accordingly, the fixed, reference voltage, Vdd, should be higher than a low to high voltage transition.

Specifically, the following operations may occur.

(i) When the moving voltage, Vin, crosses the fixed, reference voltage, Vdd, from low to high, there is a low to high transition at Vout of the comparator 12, e.g., Vout becomes high. When Vout of the comparator 12 is high, the input to the transistor 20 is also high and the transistor is turned ON. When the transistor 20 is ON, the control gate of the depletion mode device 18 is pulled to ground, GND.

(ii) When the moving voltage, Vin, crosses the fixed, reference voltage, Vdd, from high to low, there is a high to low transition at Vout of the comparator 12, e.g., Vout becomes low. When Vout of the comparator 12 is low, the input to the transistor 20 is also low and the transistor 20 is turned OFF. When the transistor 20 is OFF, the control gate of the depletion mode device 18 is pulled up by the resistor 24 to Vdd1.

Accordingly by controlling the transistor 20, it is possible to control the gate bias of the depletion mode device 18. In this way, it is possible to control a pinch-off voltage of the depletion mode device 18 which controls the reference voltage, Vdd, to the comparator.

Figure 2:
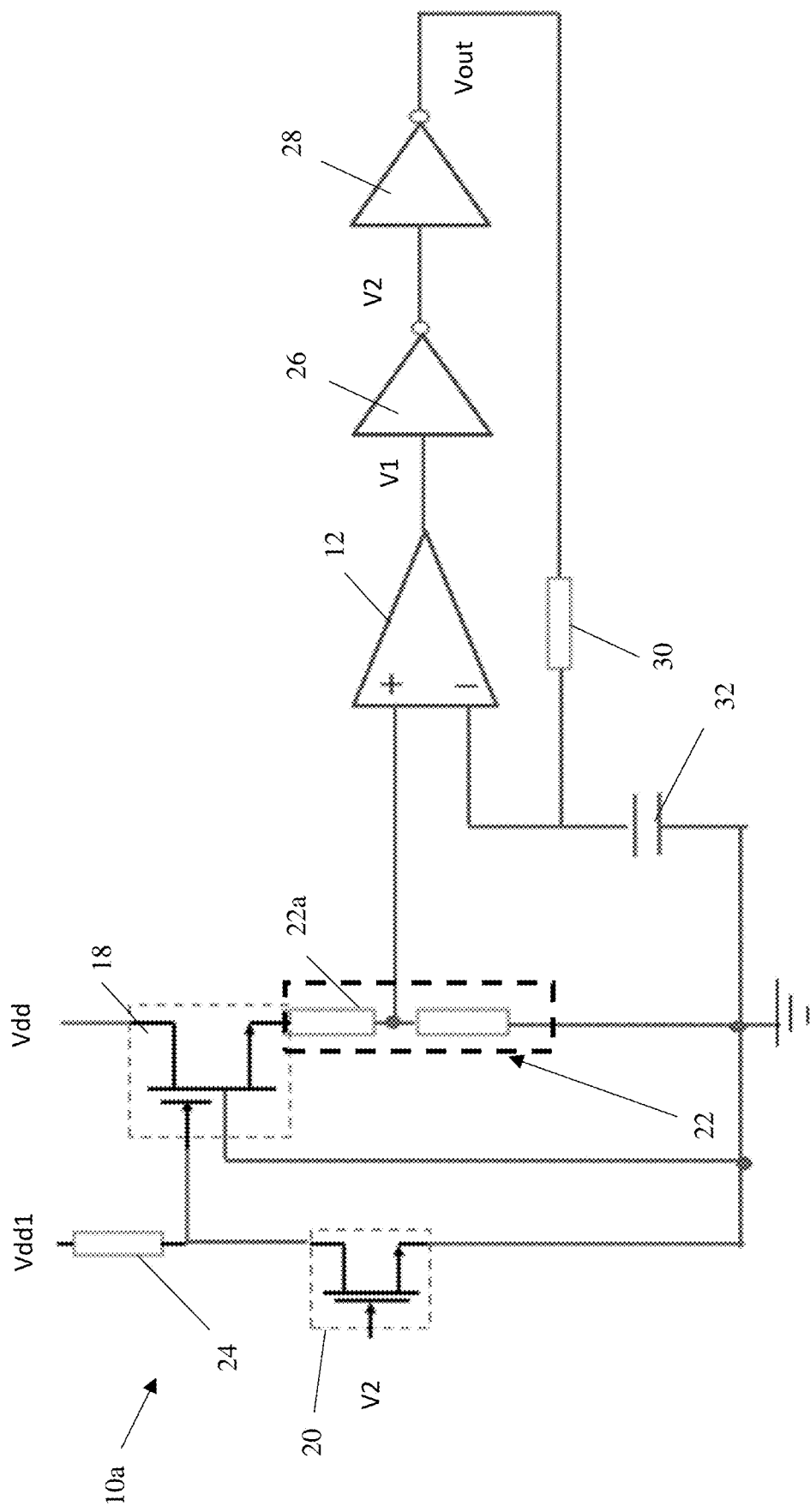
FIG. 2 shows a ring oscillator circuit in accordance with aspects of the present disclosure.

FIG. 2 shows a ring oscillator circuit in accordance with aspects of the present disclosure. In embodiments, the ring oscillator circuit 10a of FIG. 2 includes the comparator 12. The comparator 12 may be connected at its output to inverters 26, 28, in series. The output of the comparator 12 is V1, the output of the inverter 26 is V2 and the output of the inverter 28 is Vout. The output V2 of the inverter 26 is fed back to the transistor 20. Although not shown, the comparator 12 can also be isolated by the option clamps as shown in FIG. 1 at the + and – inputs.

In the circuit 10a of FIG. 2, the moving voltage, e.g., Vout, is provided as an input to the comparator 12. In comparison to the circuit 10 of FIG. 1, in the circuit 10a the moving voltage, e.g., Vout, is provided as an inverting input to the comparator 12. Vout is generated by output, V1, passing through the inverts 26, 28. Vout may be be fed through resistor 30 prior to being fed into the input of the comparator 12. A capacitor 32 may be provided between ground and the resistor 30 to ensure that Vout is not fed into the transistor 24; instead, output, V2, of the first inverter 26 is fed into the transistor 24.

As in the circuit 10, Vdd is fed through a control gate (e.g., PGaN gate) of the depletion mode device 18 and a resistor 22a of a resistor divider 22 to provide a fixed, reference voltage to the comparator 12. In this circuit 10a, though, the fixed, reference voltage is fed as a non-inverting input of the comparator 12. Also, as in the circuit 10 of FIG. 1, the output of the transistor 20, e.g., enhancement mode device, is used to control the pinch-off voltage of the depletion mode device 18. The remaining features of the circuit 10 are similar to that of the circuit 10 of FIG. 1 such that no further explanation is required for a complete understanding of the circuit 10a.

In operation, controlling the gate voltage of the transistor 20 will modulate the gate voltage, e.g., pinch-off voltage, of the depletion mode device 18 in a manner consistent with that described herein. Accordingly by controlling the transistor 20, it is possible to control the gate bias of the depletion mode device 18. In this way, it is possible to control a pinch-off voltage of the depletion mode device 18 which controls the reference voltage, Vdd, to the comparator.

The comparator circuits of the present disclosure can be manufactured in a number of ways using a number of different tools. In general, though, the methodologies and tools are used to form structures with dimensions in the micrometer and nanometer scale. The methodologies, i.e., technologies, employed to manufacture the comparator circuits of the present disclosure have been adopted from integrated circuit (IC) technology. For example, the structures are built on wafers and are realized in films of material patterned by photolithographic processes on the top of a wafer. In particular, the fabrication of the comparator circuits uses three basic building blocks: (i) deposition of thin films of material on a substrate, (ii) applying a patterned mask on top of the films by photolithographic imaging, and (iii) etching the films selectively to the mask.

The comparator circuits can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The comparator circuits may be used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit comprising:
    a comparator;
    a transistor connected to an output of the comparator;
    a depletion mode device connected to ground and a first reference voltage (Vdd), and comprising a control gate directly connected to an output of the transistor and to an input of the comparator, the output of the transistor controlling a pinch-off voltage at the control gate of the depletion mode device; and
    a first resistor connected directly between a predetermined voltage (Vdd1) and directly connected to the control gate of the depletion mode device, wherein when the transistor is OFF, the control gate body of the depletion mode device is pulled up by the resistor to the predetermined voltage (Vdd1) fed into the control gate.

2. The circuit of claim 1, wherein the control gate comprises a pGaN gate.

3. The circuit of claim 1, further comprising a resistor of a resistor divider that provides a fixed reference voltage to the input of the comparator.

4. The circuit of claim 3, further comprising a clamp positioned between the resistor and the comparator and another clamp connected to another input of the comparator.

5. The circuit of claim 1, further comprising a plurality of inverters in series with the comparator.

6. The circuit of claim 5, further comprising a resistor connecting to an inverting input of the comparator.

7. The circuit of claim 1, wherein the input of the transistor is an output of an inverter connected to the comparator in series and the output of the depletion mode device.

8. The circuit of claim 1, wherein an input of the transistor is directly from an output of the comparator.

9. The circuit of claim 4, wherein:
the control gate is controlled by the output of the transistor;
the clamp and the another clamp comprise fixed pinch off depletion mode devices that protect the comparator from noise; and
the clamp is positioned between the depletion mode device and the resistor and the another claims is positioned between ground and the input of the comparator.

10. The circuit of claim 9, wherein the control gate is pulled to ground 29 when the transistor is high and pulled to the predetermined voltage (Vdd1) when the transistor is low.

11. A circuit comprising:
a comparator which compares a fixed, reference voltage to a moving voltage;
a transistor which is controlled by an output of the comparator;
a control gate integrated with a depletion mode device, which is pulled to ground when an output of the transistor is high and pulled to a predetermined voltage (Vdd1) when the output of the transistor is low, wherein the control gate is connected directly to an output of the transistor and an input of the comparator; and
a resistor connected between the predetermined voltage (Vdd1) and directly to a control body of the control gate, the predetermined voltage (Vdd1) being fed into the control body through the resistor to pull the control gate high.

12. The circuit of claim 11, wherein the transistor controls a pinch-off voltage of the control gate and further comprising a first clamp positioned between the control gate and the comparator and a second clamp connected between ground and another input of the comparator.

13. The circuit of claim 11, wherein the transistor receives its input directly from an output of the comparator.

14. The circuit of claim 11, further comprising a plurality of inverters connected in series with an output of the comparator.

15. The circuit of claim 14, further comprising a resistor in series with an input of the comparator.

16. The circuit of claim 14, wherein the transistor receives its input directly from an output of a first inverter of the plurality of inverters connected in series with the output of the comparator.

17. The circuit of claim 15, wherein the input to the comparator comprises an output of a second inverter of the plurality of inverters connected in series with the output of the comparator.

18. The circuit of claim 11, further comprising a resistor of a resistor divider between the output of the control gate and an input to the comparator.

19. A method of operation comprising:
controlling an ON state and OFF state of a transistor by using an output of a comparator;
bringing a control gate of a depletion mode device to ground when the transistor is in the ON state;
pulling a control to a first voltage (Vdd1) through a resistor connecting directly to the control gate when the transistor is in the OFF state; and
feeding a moving voltage (Vin) and a fixed, reference voltage (Vdd) passing through the control gate of the depletion mode device, into respective inputs of the comparator.

20. The method of claim 19, wherein an output of the transistor controls a pinch-off voltage of the depletion mode device.

* * * * *